United States Patent
Schlehahn et al.

(10) Patent No.: US 6,419,439 B2
(45) Date of Patent: *Jul. 16, 2002

(54) INDEXER FOR MAGAZINE SHELVES OF A MAGAZINE AND WAFER-SHAPED OBJECTS CONTAINED THEREIN

(75) Inventors: Volker Schlehahn; Klaus Schultz, both of Jena (DE)

(73) Assignee: Jenoptik Aktiengesellschaft, Jena (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/687,643

(22) Filed: Jul. 26, 1996

(30) Foreign Application Priority Data

Sep. 27, 1995 (DE) .......................... 195 35 871

(51) Int. Cl.⁷ .................................................. H01J 40/14
(52) U.S. Cl. .................. 414/331; 414/416; 414/934
(58) Field of Search ................... 414/416, 438, 414/439, 420, 431, 934

(56) References Cited

U.S. PATENT DOCUMENTS

| | | | | |
|---|---|---|---|---|
| 3,930,684 A | * | 1/1976 | Lasch et al. ............... | 302/2 R |
| 4,983,093 A | * | 1/1991 | Foulke et al. ............. | 414/416 |
| 5,280,983 A | * | 1/1994 | Maydan et al. ........... | 294/119.1 |
| 5,308,993 A | * | 5/1994 | Holman et al. ............ | 414/936 |
| 5,319,216 A | * | 6/1994 | Mokuo et al. ............. | 414/938 |
| 5,452,078 A | | 9/1995 | Cheng | |
| 5,605,428 A | * | 2/1997 | Birkner et al. ............ | 414/416 |
| 5,642,978 A | | 7/1997 | Lahne et al. | |
| 5,645,391 A | * | 7/1997 | Ohsawa et al. ............ | 414/416 |
| 6,211,514 B1 | * | 4/2001 | Schultz ..................... | 250/222.1 |

FOREIGN PATENT DOCUMENTS

| | | | | |
|---|---|---|---|---|
| JP | 1144647 | | 6/1989 | |
| JP | 1248634 | | 10/1989 | |
| JP | 3160744 | | 7/1991 | |
| JP | 482691 | | 3/1992 | |
| JP | 4-215454 | * | 8/1992 | ............. 414/940 |
| JP | 538761 | | 5/1993 | |
| JP | 7-71929 | * | 3/1995 | |
| WO | 94/20979 | * | 9/1994 | ............. 414/416 |
| WO | 94/234443 | * | 10/1994 | |

* cited by examiner

*Primary Examiner*—Thomas J. Brahan
(74) *Attorney, Agent, or Firm*—Perman & Green, LLP

(57) ABSTRACT

An indexer for magazine shelves of a magazine and wafer-shaped objects contained therein has the object of ensuring accurate access in any desired and predeterminable magazine plane, also for magazines which are provided with an opening on only one removing and charging side, by means of an all-purpose indexing, wherein it is possible to differentiate between various standardized magazine and wafer formats. The magazine shelves and the wafer-shaped objects are detected by an optoelectronic sensor arrangement, at least a portion of which is designed as a distance measuring system. The indexer is applicable in the manufacture of integrated circuits, in particular, for handling wafer-shaped objects in the form of semiconductors and masks.

12 Claims, 6 Drawing Sheets

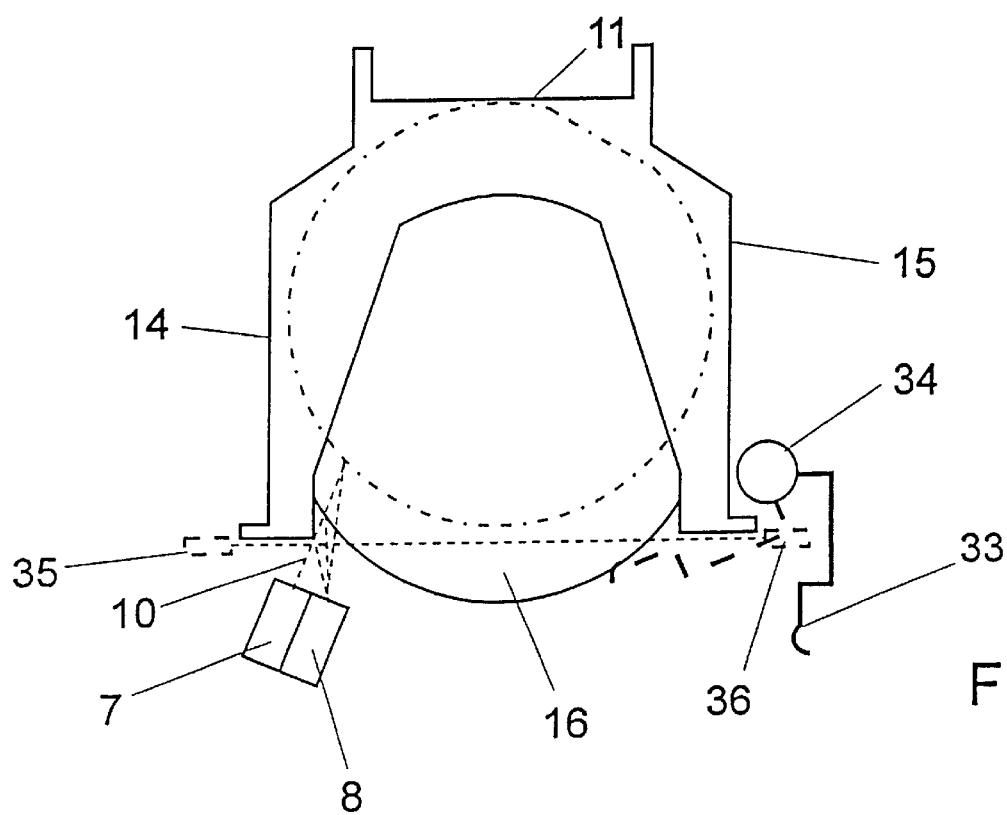

INDEXER FOR MAGAZINE SHELVES OF A MAGAZINE AND WAFER-SHAPED OBJECTS CONTAINED THEREIN

BACKGROUND OF THE INVENTION a) Field of the Invention

The invention is directed to an indexer for magazine shelves of a magazine and wafer-shaped objects contained therein, in particular semiconductor wafers and templates or masks, the magazine and a first handling plane for removing and charging being adjustable vertically relative to one another for the processing of such wafer-shaped objects, with an optoelectronic sensor arrangement for detecting the objects and magazine shelves relative to a reference plane which is in a fixed relationship to the first handling plane Such technical solutions are applicable in the manufacture of integrated circuits, in particular for handling tasks, and are known, e.g., from DE 43 06 957 C1.

b) Description of the Related Art

In the manufacture of integrated circuits, wafer-shaped objects such as semiconductor wafers and masks must be transported between different processing stages to individual processing machines. In increasing measure, such transporting takes place in standardized transport containers, referred to as standard mechanical interface boxes (SMIF boxes), the magazine within whose shelves the wafer-shaped objects are located being fastened in a suitable manner to the base of these transport containers. For the purpose of charging the processing machines, the magazines are unloaded from the transport containers by suitable devices and the wafer-shaped objects are removed by a removing and charging mechanism. After processing, the wafer-shaped objects are returned to the shelves of the magazine and the magazine is returned to the transport container.

A disadvantage in the possible use of impact pressure sensors or reflex couplers which act on the rear side of the wafer-shaped objects to detect the latter consists in that the magazine must be handled in a determined sequence. In so doing, the objects may not be removed from the magazine in an arbitrary manner. Rather the charging magazine must be emptied from the bottom up and the dispensing magazine must be filled from the top down because of the required sensor arrangement and the removing and charging of semiconductor wafers associated therewith. Consequently, the allocation of the object to a determined level is not adhered to. Such technical solutions cannot be applied for the conventional removal of random samples for inspection purposes or for use in the above-mentioned transport containers.

It is known from U.S. Pat. No. 4,895,486 to determine the presence of wafer-shaped objects in a carrier (magazine) and their position relative to a reference plane in the carrier by means of a monitoring device in that a first signal indicating the presence of such an object is combined with a position signal for the object. The first signal is obtained by an optoelectronic sensor which monitors the space in which the objects can be found. The second signal is formed via a position encoder coupled with a drive for moving the carrier up and down To determine the reference plane and possible resting place of the objects, the space in the carrier is divided vertically into segments In addition to a segment serving as a reference plane and segments without wafer-shaped objects, window segments in which objects may be present are defined. An indexing of the carrier is effected in that, after the reference plane in the carrier is detected by measuring techniques, the locations of the window segments are determined and stored by computer based on construction data of the respective carrier being used.

Although the quantity of objects and the locations in which they are deposited relative to a reference plane with in the carrier can be determined by means of the described solution, the carrier or the removing and charging mechanism must be positioned in the grid dimension of the shelves of the carrier in order to remove the objects from the carrier. If divergent carrier geometries and tolerances are not allowed for in so doing, errors cannot be ruled out. Problems arise in particular when an empty carrier is to be charged optionally.

Further, it is possible to monitor the correct position of the object in the carrier by means of an additional optoelectronic sensor when the carrier is being transported upward in the vertical direction. This is done in order to prevent damage to objects protruding from the carrier when returning the latter to the transport containers. If it is detected that an object is protruding from the carrier due to defective or incorrect operation of the handling system, the transport of the magazine is halted and manual intervention on the part of the operator is required to eliminate the error. While the detection of protruding or projecting objects has practical importance, the required manual intervention causes unnecessary delays in continued processing by interfering with the clean room conditions and, in some cases, the climatic conditions of the processing machines within the machine enclosure. This can result in failure of the machine.

The solution described in DE 43 06 957 C1 meets all of the demands mentioned above in that the position of the wafer-shaped objects as well as the position of the magazine shelves relative to a reference plane are detected by means of a bundle of measurement rays emitted by an optoelectronic sensor formed of a transmitter and receiver The reference plane is in a fixed constructional relationship with a handling plane for removing and charging. The magazine is adjustable vertically in a measurable manner relative to a handling plane for removing and charging by means of a magazine receiving device via a magazine elevator.

A disadvantage consists in that magazines must be restricted to those in which two opposite sides are freely accessible. This indexing arrangement is not applicable in magazines which are only open at the side serving for removing and charging. Another disadvantage consists in that it is not possible to differentiate directly between different magazine sizes or formats.

OBJECT AND SUMMARY OF THE INVENTION

Therefore, the problem arises of ensuring accurate access in any desired and predeterminable magazine plane, also for magazines which are provided with an opening on only one removing and charging side, by means of an all-purpose indexing, wherein it is possible to differentiate between various standardized magazine and wafer formats. A primary object of the present invention is to overcome this stated problem.

This object is met, according to the invention, by an indexer for magazine shelves of a magazine and wafer-shaped objects contained therein, in particular semiconductor wafers and masks, the magazine and a first handling plane for removing and charging being adjustable vertically relative to one another for the processing of such wafer-shaped objects, with an optoelectronic sensor arrangement for detecting the objects and magazine shelves relative to a reference plane which is in a fixed relationship to the first handling plane, in that at least a part of the optoelectronic sensor arrangement is designed as a distance measuring system.

If the wafer-shaped objects are opaque frontwise from one edge to the other, the entire sensor arrangement can be designed as a distance measuring system which detects radiation scattered at the edges of the objects and magazine shelves.

In this case, the distance measuring system contains a transmitter and a receiver arranged at an open side of the magazine so that a bundle of measurement rays proceeding from the transmitter with its center ray lying in the reference plane detects successively the wafer-shaped objects and shelf-forming projections for the objects by means of the vertical adjustment of the magazine relative to the reference plane, the objects and the projections being distinguishable from one another because of the different distances relative to the transmitter As a result of the vertical adjustment, an image of the magazine shelves and of the wafer-shaped objects contained therein is generated by an amplitude modulation of the output signal. This is brought about by the change in the distance between the transmitter and the reflecting item in the reference plane vertical to the direction of movement. The received signal, whose value depends on the distance between the transmitter and the point of incidence, is converted into an analog signal by means of an electronic amplifier.

The sensor system, whose bundle of measurement rays lies in a horizontal plane, determines the vertical position and, by determining the coordinates in the horizontal plane, ascertains whether the item in question is a magazine shelf for a wafer-shaped object or the object itself.

In the case of wafer-shaped objects which are transparent frontwise from one edge to the other, the light scattered in the backward direction can only be measured under certain conditions.

Therefore, the optoelectronic sensor arrangement advantageously comprises a distance measuring system, which is arranged at an open side of the magazine in the reference plane and contains a transmitter and a receiver, and an additional receiver which is arranged at the opposite open side of the magazine. A bundle of measurement rays proceeding from the transmitter is directed on the objects and projections so as to be inclined in the reference plane relative to the vertical incident radiation.

Whereas the distance measuring system serves to detect shelf-forming projections, a parallel-plate effect brought about by the presence of an object can be utilized for detecting the object owing to the arrangement of an additional receiver. The additional receiver can be placed either at the location struck by the bundle of measurement rays if no object is located in the magazine shelf or at the location struck by the measurement ray bundle which is offset owing to the presence of an object.

A sensor arrangement formed of a distance measurement system which contains a transmitter and a receiver arranged at an open side of the magazine, an additional transmitter on the same side, and an additional receiver arranged at the opposite open side of the magazine is also suitable for objects which are transparent frontwise from one edge to the other.

In this sensor arrangement, a bundle of measurement rays proceeding from the additional transmitter is directed only on the object so as to be inclined in the reference plane relative to the vertical incident radiation. The distance measuring system serves to detect shelf-forming projections. The additional receiver is used in the manner described above The receiver and transmitter of the distance measuring system are advantageously combined in a structural unit.

By means of the technical solution according to the invention, the actually occurring ratios in a magazine to be indexed are determined in that the magazine shelves and the wafer-shaped objects contained therein are detected with measuring techniques. Accordingly, the objects may be removed and restored optionally so at to enable any type of re-sorting or rearrangement between magazines with different shelf spacing as well as with respect to a reference plane within the magazine. Empty magazines can also be filled as desired. The technical solution also allows the use of magazines or magazine-like containers which are closed on all sides but that side having the charging and removing opening.

Given a suitable design of the magazine, which is often ensured at the present time owing to the global standard, different magazine formats can be determined by means of the value of the analog signal alone. The position of the wafer-shaped object can also be valuated in every plane parallel to the reference plane using the value of the analog signal determined by the distance and this valuation can be used to distinguish between wafer sizes or to monitor the correctly positioned depositing of the wafer-shaped object following a handling process or prior to the start of the handling process.

If depositing is not effected in the proper location, a returning device is advantageously provided in a second handling plane parallel to the first handling plane for positioning wafer-shaped objects protruding from the magazine. The actuation of the wafer returning device is contingent upon the value of the sensor signal of the distance measuring system in the case of wafer-shaped objects which are opaque frontwise from one edge to the other. In the case of transparency, another sensor system can be used for detecting objects protruding from the magazine. Triggered by the sensor signal, the wafer returning device guides the object back into the magazine shelf without external intervention. Further transport of the magazine in the transport containers is ensured and damage to protruding objects is prevented without manual intervention.

The invention will be explained more fully in the following with reference to the schematic drawing.

BRIEF DESCRIPTION OF THE DRAWINGS

In the drawings:

FIG. 9 shows a top view of the magazine of a wafer returning device.

DESCRIPTION OF THE PREFERRED EMBODIMENTS

Figure 1:
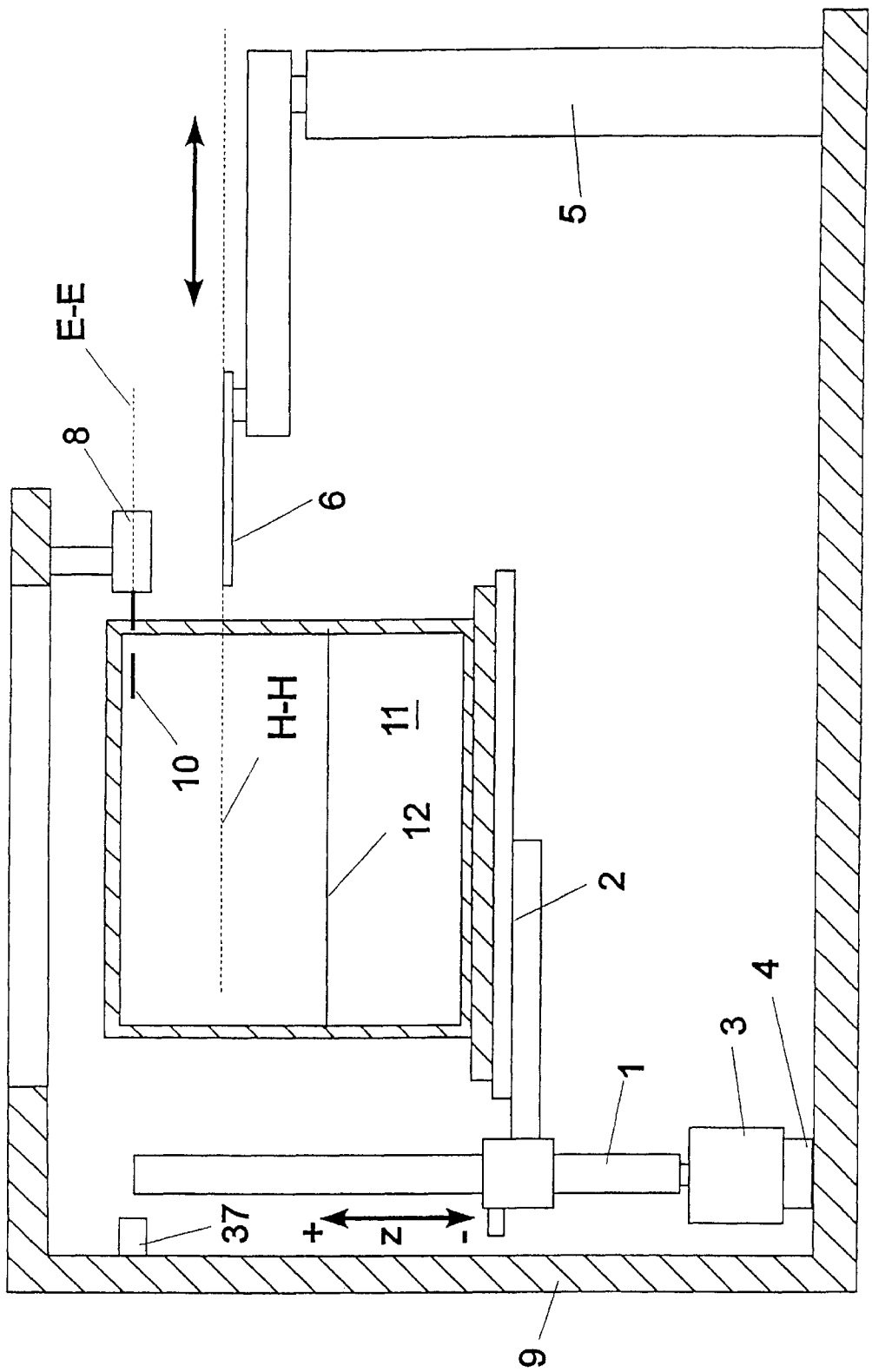
FIG. 1 shows part of a handling device partially in section.

A device for handling wafer-shaped objects, only part of which is shown in FIG. 1, contains in its interior a magazine seat 2 which can be raised and lowered in the z direction (vertically to the supporting surface of the handling device) via a spindle drive 1. The spindle 1 is driven by a stepper motor 3 which is outfitted with an angle measuring system 4 so that the distance traversed when raising or lowering can be determined via the pitch of the spindle.

Together with a control computer 25, not shown, the stepper motor 3 along with its control electronics and the angle measuring system 4 form a position regulator of a magazine elevator, the spindle 1 and magazine seat 2 also making up a part of the latter.

A removing and charging device 5 has a handling arm 6 working in a handling plane H—H and is fastened to a shared frame 9 as are the magazine elevator and an opto-electronic sensor containing a transmitter 7 (visible in FIG. 2) and a receiver 8 in a housing. A bundle 10 of measurement rays proceeding from the transmitter 7 extends with its center ray in a reference plane E—E for indexing magazine shelves located in a magazine 11 and wafer-shaped objects 12 contained therein. The distance between plane E—E and the handling plane H—H is selectable within the operating range of the spindle drive 1.

Figure 2:
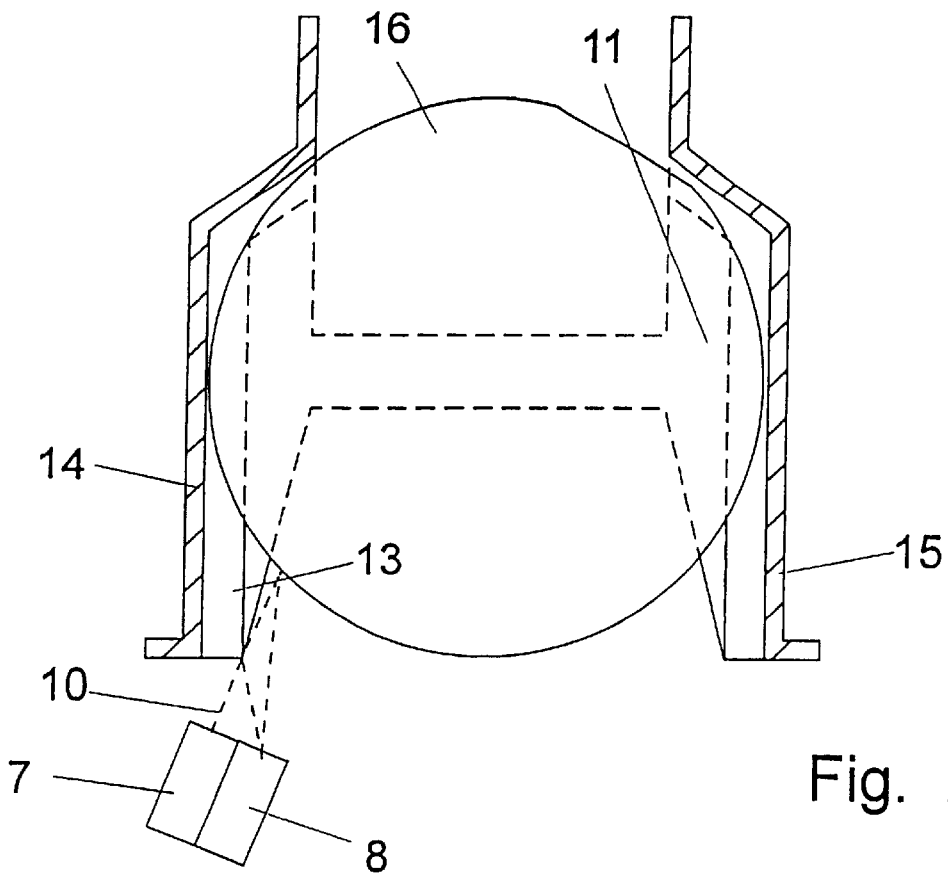
FIG. 2 shows a sensor arrangement for a wafer magazine.

In FIG. 2, the transmitter 7 and the receiver 8 are arranged adjacent to one another. The measurement ray bundle 10 is directed on shelf-forming projections 13 at walls 14 and 15 and on the front edge of inserted semiconductor wafers 16 as wafer-shaped objects. By means of diffuse reflection of the ray bundle 10 either at one of the projections 13 or at the front edge of an inserted semiconductor wafer 16, analog signals corresponding to the distances are generated. The values of the analog signals differ from one another such that the projections 13 can be clearly distinguished from semi-conductor wafers 16. The oblique irradiation of the magazine 11 shown in the drawing was chosen in order to create favorable conditions for diffuse reflection.

Figure 3:
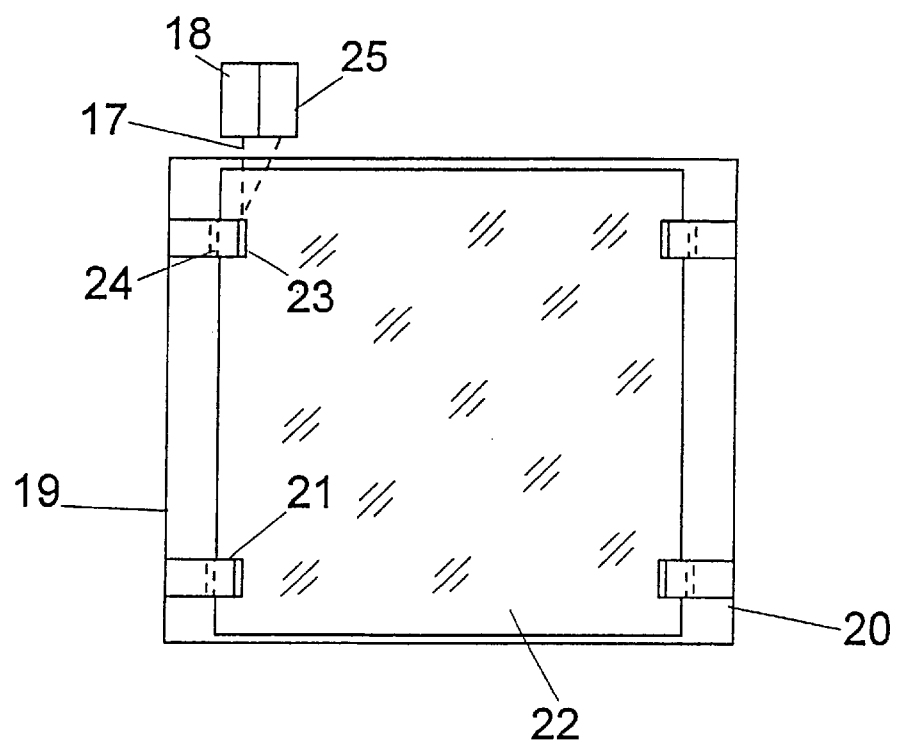
FIG. 3 shows a first sensor arrangement for a mask magazine.

In the mask magazine shown in FIG. 3, a measurement ray bundle 17 proceeding from a transmitter 18 is directed parallel to walls 19, 20 onto shelf-forming projections 21 and, if required, simultaneously on masks 22 located in the shelves. The masks lie on supports 23 of the shelves 21 and are prevented from slipping by means of lateral stops 24.

Owing to the different distance between the transmitter 18 and projection 21 on the one hand and the transmitter 18 and mask 22 on the other hand, analog signals of different values are also obtained at a receiver 25 in a mask magazine. The projection 21 and the mask 22 can be distinguished on the basis of the value of the analog signal.

Figure 4:
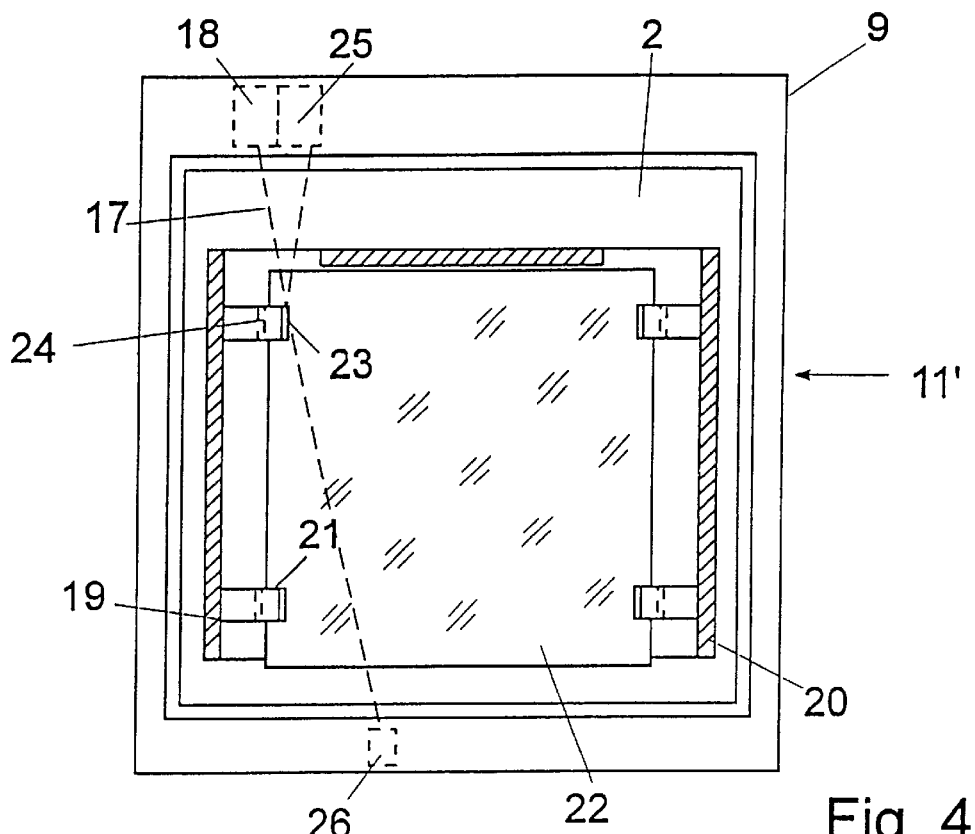
FIG. 4 shows a second sensor arrangement for a 5"-mask magazine in a section through a magazine in the plane of a magazine shelf with a mask below shelf-forming projections.
Figure 5:
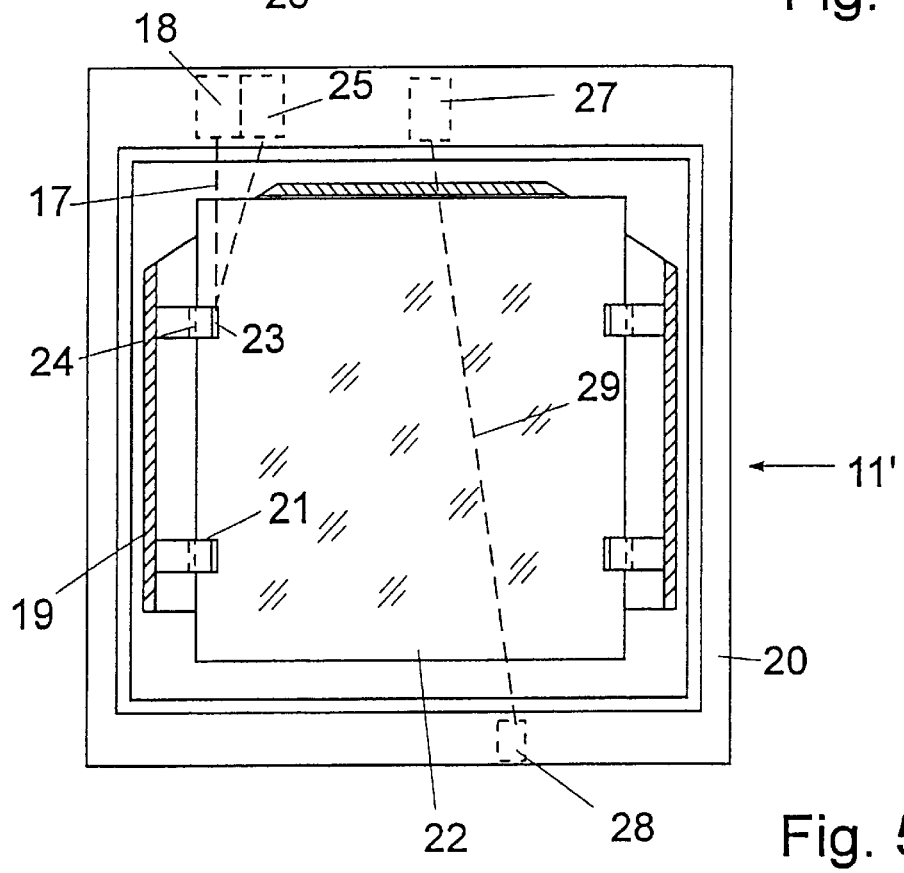
FIG. 5 shows a third sensor arrangement for a 6"-mask magazine in a section through a magazine in the plane of a magazine shelf with a mask below shelf-forming projections.

If the objects to be detected are transparent frontwise from one edge to the other (masks with transparent lateral faces), it is advisable, in accordance with FIGS. 4 and 5 to direct the measurement ray bundle 17 and 29, respectively, on the mask 22 and the projection 21 in the reference plane so as to be inclined at an acute angle relative to the vertical incident radiation.

The construction according to FIG. 4 provides another receiver 26 at the opposite open side of the magazine which measures in a spatially-sensitive manner. Due to a plane-plate effect, the measurement ray bundle 17 exits so as to be offset relative to its entrance into the mask 22, depending on the index of refraction, when a mask 22 is located in a magazine shelf.

In the more favorable variant in technical aspects regarding the arrangement, the additional receiver 26 is arranged at the location struck by the measurement ray bundle when there is no mask 22 located in the magazine shelf. If a mask 22 is located in the magazine shelf, the receiver 26 does not receive any signal. Conversely, the additional receiver can naturally also be provided at the location of incidence of the offset measurement ray bundle.

In FIG. 5, an additional transmitter 27 and an additional receiver 28 are provided with a measurement ray bundle 29 which is inclined relative to the vertical incident radiation. The manner of operation corresponds in an analogous manner to that of the arrangement shown in FIG. 4. In both cases, the distance measuring system serves to detect the shelf-forming projections 21 and the additional receiver 26 and 28, respectively, serves to detect the mask 22.

The distances between the magazine shelves and the mask magazines are subject only to slight tolerances due to their process of manufacture. This fact along with the fact that standardized magazines are frequently employed in a device in semiconductor manufacturing offers the possibility of determining the position of the magazine shelves indirectly and accordingly also distinguishing the magazine format for an empty magazine.

Figure 7:
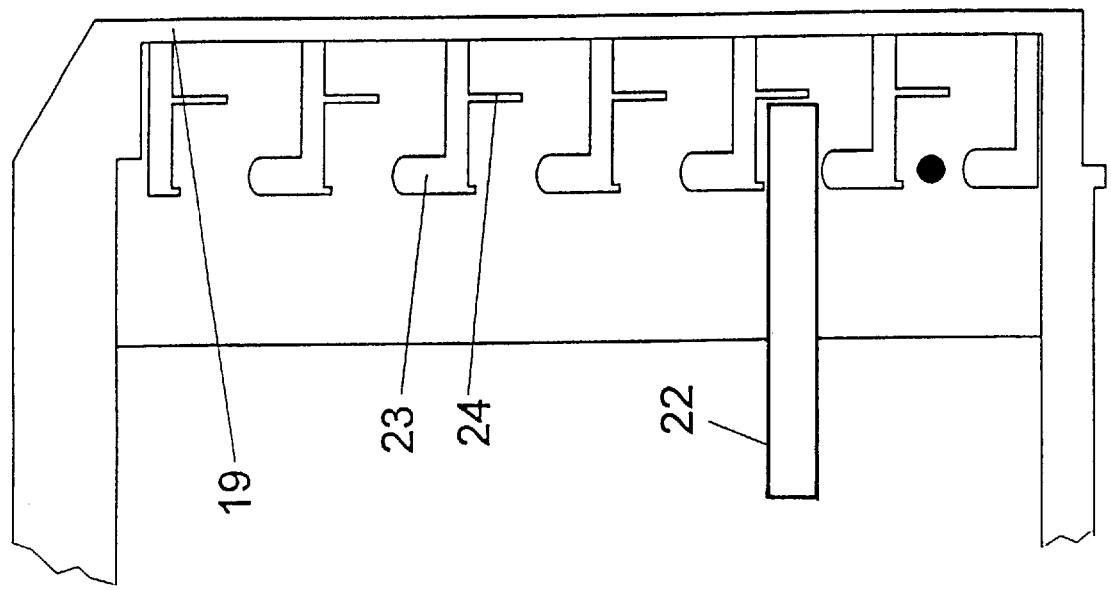
FIG. 7 shows a wall section from a magazine for objects of a second, larger format.
Figure 6:
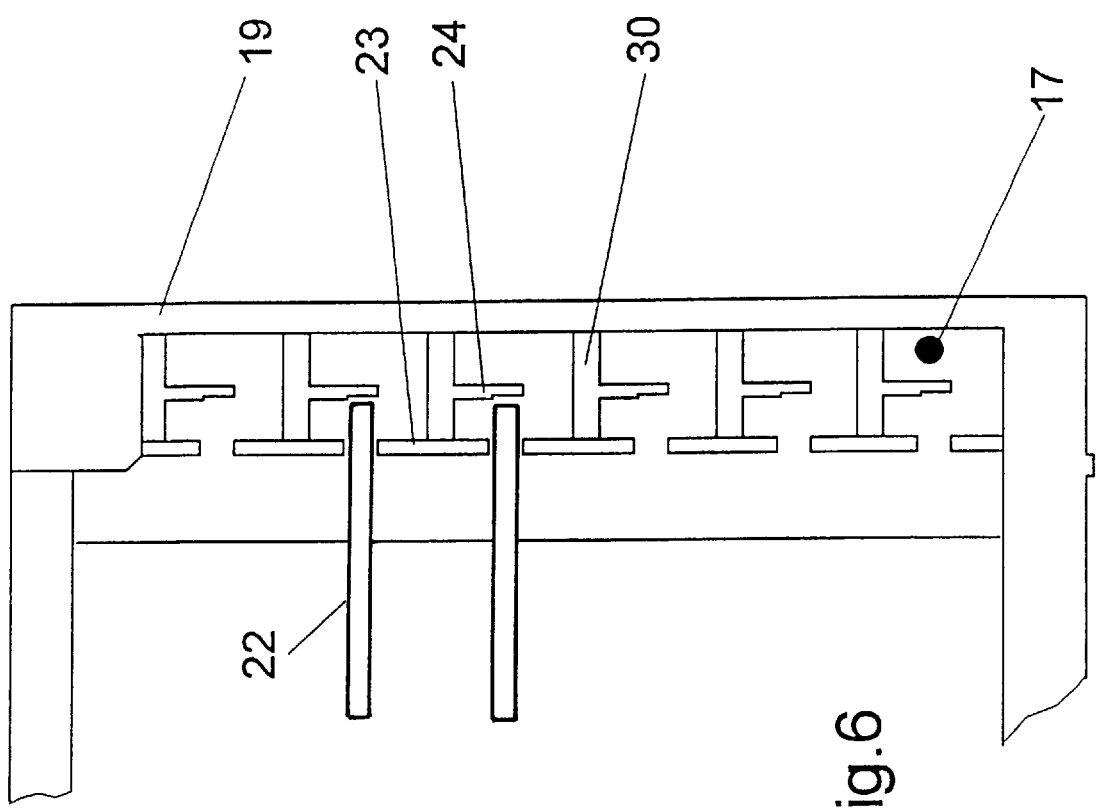
FIG. 6 shows a wall section from a magazine for objects of a first, smaller format.
Figure 8:
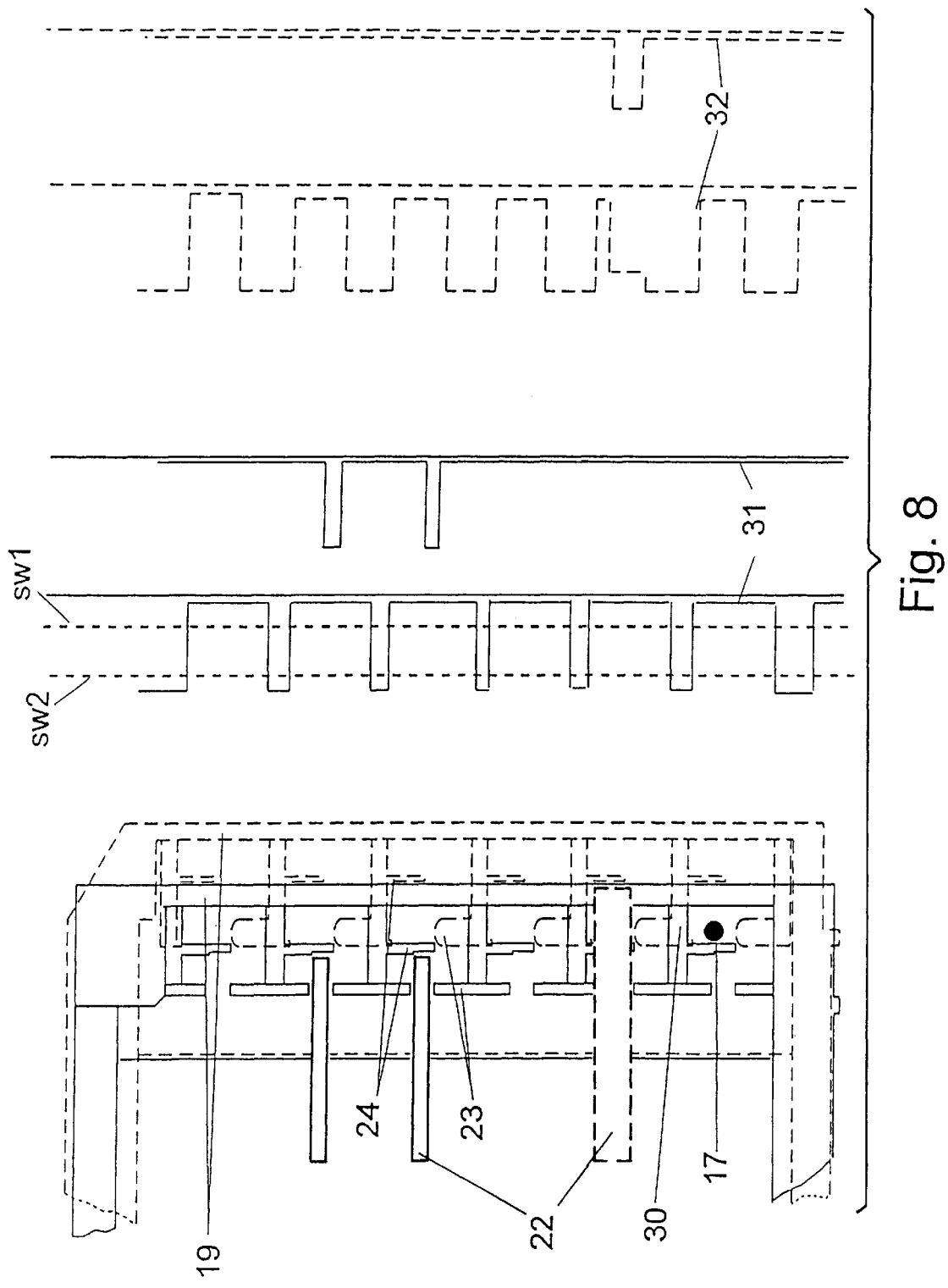
FIG. 8 shows the wall portions in FIGS. 4a and 4b projected one on top of the other together with associated optoelectronic scan images.

FIGS. 6 to 8 serve to illustrate the procedure for determining the different magazine format. FIG. 6 shows a 5"-magazine and FIG. 7 shows a 6"-magazine. The reference numbers correspond to those of FIG. 3. In FIG. 8, the two magazines are projected on top of one another corresponding to their positions in a processing device.

With a stationary sensor arrangement corresponding to FIG. 3, the measurement ray bundle 17 scans the webs 30 in the 5"-mask magazine shown in solid lines due to the vertical movement of the projections 21 and scans the supports 23 in the 6"-mask magazine shown in dashed lines. The location of support in the 5"-mask magazine can be determined based on the fixed geometric relationship between the support and projection. Typical signal waveforms occurring during scanning are designated by 31 for the 5"-mask magazine and by 32 for the 6"-mask magazine.

Scanning is effected by the measurement ray bundle 17 as a result of the vertical movement of the magazine, wherein the analog value of the sensor signal and the associated value of the vertical position which is determined via the position regulator of the magazine elevator are stored. Threshold values sw1 and sw2 can be set for the analog signal in order to reduce data.

The magazine shelves and masks can be exactly positioned with respect to the handling plane H—H by means of a selectable correction value corresponding to the distance between the web 30 and the support 23 and the linking of the stored vertical position values with the threshold values.

As will be clear from FIG. 9 with reference to a semi-conductor magazine, the use of a distance measuring system is also suitable for testing the correctness of the position of wafer-shaped objects which are opaque frontwise from one edge to the other by means of the value of the analog signal determined by the distance in every plane parallel to the reference plane.

If the wafer-shaped objects have not been deposited correctly, a returning device 33 in a second handling plane parallel to the first handling plane E—E serves to push the protruding semiconductor wafers 16 back into the magazine. Accordingly, transport of the magazine 11 can proceed without interference and without manual intervention.

The returning device 33 is formed of a linkage mechanism or lever mechanism 34 which is driven by an electric motor and executes a swiveling movement of 90° during a revolution of its drive (not shown). The reversal point of the lever of the mechanism 22 is so arranged that it pushes the semiconductor wafer 16 into the magazine 11 and then returns to an initial position which is monitored by a limit switch.

When the object is transparent from one edge to the other, another sensor shown in dashed lines can be used, this sensor having a transmitter 35 and a receiver 36, and its sensor signal determines the actuation of the returning device 33. A returning device can be used in an analogous manner in mask magazines.

The stepper motor 3, angle measuring system 4, transmitters 7, 18, 27 and 35, receivers 8, 25, 26 and 36, another sensor 37 which is rigidly connected with the frame 9, the lever mechanism 33, and the limit switch are connected with a control computer for carrying out the invention. Analog-to-digital converters are connected between the sensors and the control computer.

After the magazine seat 2 is positioned relative to the additional sensor 37, which is at a known distance relative to the handling plane H—H and reference plane E—E, and after the counter of the angle measuring system is reset to zero, the magazine 11 is automatically removed by its base from a dust-proof transport container, not shown, and is taken over by the magazine seat 2 for indexing the magazine shelves and the wafer-shaped objects 12, 22 located therein. The magazine seat 2 is then lowered, i.e., moved in the negative z direction, until exceeding a threshold value sw2 of threshold values sw1 and sw2 which are advantageously determined for the purpose of data reduction. The distance of the base of the magazine 11 from the reference plane E—E is thus detected.

As the magazine 11 moves through the measurement plane E—E in the direction of its shelves, which are located one above the other, an amplitude-modulated sensor output signal is obtained at the receivers 8, 25, 26 and 28 as a function of the path, this sensor output signal representing the imaging of the magazine shelves and objects 12, 22 or the image is generated from this sensor output signal by taking into account the fixed geometrical relationships. By means of the control computer, the sensor output signal, after being converted from analog to digital, is combined with the measurement signal of the angle measuring system 4 and stored.

In order to remove an object 12, 22 from the magazine 11 or wafer magazine or to place it in an empty magazine shelf, a value for the distance between the measurement plane E—E and the first handling plane H—H is added to the determined counter reading and the magazine 11 or wafer magazine is moved into the corresponding z position by means of the magazine lift.

While the foregoing description and drawings represent the preferred embodiments of the present invention, it will be obvious to those skilled in the art that various changes and modifications may be made therein without departing from the true spirit and scope of the present invention.

What is claimed is:

1. An indexer for magazine shelves of a magazine and the wafer-shaped objects contained therein, the magazine and a first handling plane for removing and charging the objects being adjustable vertically relative to one another for the processing of such wafer-shaped objects, the indexer having an optoelectronic sensor arrangement for detecting the objects and magazine shelves relative to a reference plane which is in a fixed relationship to the first handling plane, the optoelectronic sensor arrangement having a transmitter and a receiver, and wherein at least a part of the optoelectronic sensor arrangement is designed as a distance measuring system for measuring, within a horizontal plane that is perpendicular to a direction of adjustment movement of the magazine, a distance to edges of the wafer-shaped objects and to edges of the magazine shelves relative to the transmitter, and further wherein the transmitter and receiver serve to detect shelf-forming projections.

2. The indexer according to claim 1, wherein said optoelectric sensor arrangement is designed completely as a distance measuring system and contains said transmitter and said receiver arranged at an open side of said magazine so that a measurement ray bundle proceeding from said transmitter with its center ray lying in said reference plane, detects successive of said wafer-shaped objects and shelf-forming projections by vertical adjustment of said magazine relative to said reference plane, said objects and projections being distinguishable from one another because of the different distances relative to said transmitter.

3. The indexer according to claim 1, wherein said optoelectronic sensor arrangement comprises said transmitter and said receiver arranged at one side of said reference plane and an additional receiver which is arranged at the opposite side of said magazine, the additional receiver serving to detect the presence of objects.

4. The indexer according to claim 3, wherein means direct a measurement ray bundle proceeding from said transmitter on said objects and projections so as to be inclined in said reference plane relative to vertical incident radiation.

5. The indexer according to claim 4, wherein said additional receiver is provided for detecting said measurement ray bundle passing unaltered in a straight line through said magazine when no objects are present.

6. The indexer according to claim 4, wherein said additional receiver is provided for detecting said measurement ray bundle which is offset by a plane-plate effect of said object which is transparent frontwise from one edge to the other.

7. The indexer according to claim 1, wherein said optoelectronic sensor arrangement comprises said transmitter and said receiver arranged at one side of said magazine, an additional transmitter on the same side, and an additional receiver arranged at the opposite side of said magazine, wherein said transmitter and receiver serve to detect shelf-forming projections and the additional receiver serves to detect the presence of said objects.

8. The indexer according to claim 7, wherein a measurement ray bundle proceeding from said additional transmitter is directed on said objects so as to be inclined in said reference plane relative to vertical incident radiation.

9. The indexer according to claim 8, wherein said additional receiver is provided for detecting said measurement ray bundle passing unaltered in a straight line through said magazine when no objects are present.

10. The indexer according to claim 8, wherein said additional receiver is provided for detecting said measurement ray bundle which is offset by a plane-plate effect of the object which is transparent frontwise from one edge to the other.

11. The indexer according to claim 1, wherein said transmitter and said receiver are combined in a constructional unit.

12. The indexer according to claim 1, wherein a returning device is provided in a second handling plane parallel to said first handling plane for positioning wafer-shaped objects projecting from said magazine, the actuation of the returning device being contingent upon the value of the sensor signal of said optoelectronic sensor arrangement in the case of wafer-shaped objects which are opaque frontwise from one edge to the other.

* * * * *